United States Patent
Ozeki et al.

(10) Patent No.: US 6,225,877 B1
(45) Date of Patent: May 1, 2001

(54) MULTILAYER TYPE PIEZOELECTRIC FILTER WITH INTERMEDIARY PRINTED CIRCUIT BOARD ELEMENTS

(75) Inventors: Eiji Ozeki, Aichi; Tatsuo Ogawa, Gifu, both of (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/384,417

(22) Filed: Aug. 27, 1999

(30) Foreign Application Priority Data

Aug. 28, 1998 (JP) .................................................. 10-242757

(51) Int. Cl.$^7$ .............................. H03H 9/58; H03H 9/60; H03H 9/05
(52) U.S. Cl. .......................... 333/189; 333/190; 333/192; 310/348
(58) Field of Search ........................... 333/189, 186–188, 333/190, 192; 310/353, 348

(56) References Cited

U.S. PATENT DOCUMENTS

| | | | |
|---|---|---|---|
| 4,864,259 | * | 9/1989 | Takamoro et al. .................... 333/189 |
| 5,109,176 | * | 4/1992 | Nguyen et al. ....................... 310/348 |
| 5,717,365 | * | 2/1998 | Kaida et al. .......................... 333/187 |
| 6,002,308 | * | 12/1999 | Gamo .................................... 333/187 |
| 6,160,462 | * | 12/2000 | Sugiyama et al. .................... 333/189 |

FOREIGN PATENT DOCUMENTS

| | | | |
|---|---|---|---|
| 54-12579 | | 3/1982 | (JP) . |
| 62-11314 | * | 1/1987 | (JP) . |
| 3-97314 | * | 4/1991 | (JP) ..................................... 333/191 |
| 4-4603 | * | 1/1992 | (JP) ..................................... 333/200 |
| 6-224687 | * | 8/1994 | (JP) ..................................... 333/190 |
| 9-18285 | * | 1/1997 | (JP) . |

* cited by examiner

*Primary Examiner*—Benny Lee
*Assistant Examiner*—Barbara Summons
(74) *Attorney, Agent, or Firm*—Larson & Taylor, PLC

(57) ABSTRACT

A piezoelectric filter which is adapted to reduce its height and to electrically and mechanically protect the resonators thereof, and is easy to manufacture and assemble, wherein a plurality of resonators $S_1$ through $S_3$ and $P_1$ through $P_3$ are surrounded by respective frame-like spacers 2a, 2b, 2c; 22a, 22b, 22c and laid one on the other with intermediary printed circuit boards 3a, 3b; 23a, 23b interposed therebetween, a top printed circuit board 4; 24 are placed on the top, a bottom printed circuit board 5; 25 provided on the lower surface thereof with a plurality of connection electrodes 18a, 18b, 18c, 38a, 38b, 38c are placed on the bottom, the frame-like spacers, the top printed circuit board and the bottom printed circuit board are bonded together along the peripheral edges thereof, and the electrodes of the resonators are electrically connected to respective connection electrodes by way of conduction patterns 13a through 13f; 33a through 33f formed on the respective printed circuit boards to produce an intended filter circuit.

9 Claims, 13 Drawing Sheets

MULTILAYER TYPE PIEZOELECTRIC FILTER WITH INTERMEDIARY PRINTED CIRCUIT BOARD ELEMENTS

BACKGROUND OF THE INVENTION

1. Field of the Invention

The present invention relates to piezoelectric filter to be suitably used for a filter circuit of mobile radio telecommunication equipment such as a portable mobile radio transmitter/receiver unit or an automobile telephone set.

2. Related Background Art

A piezoelectric filter of the type under consideration typically comprises a multiple of unit filter circuits, each having one or more than one series resonators and one or more than one parallel resonators connected to form an L-connection and arranged between an input terminal and an output terminal or a grounding terminal. The resonance frequency of the series resonators and the antiresonance frequency of the parallel resonators are made to correspond with each other and the difference between the antiresonance frequency of any of the series resonators and the resonance frequency of any of the parallel resonators is held to a constant value. These and other ideas have been proposed for piezoelectric filters comprising a plurality of resonators in order to improve the performance and reduce the required number of piezoelectric filters. An example of such conventional piezoelectric filters is disclosed in Examined Japanese UM Publication No. 57-12579.

However, in most conventional piezoelectric filters having a configuration as described above, resonators and terminal plates are typically assembled to a multilayer structure within a casing and hence they inevitably comprise a large number of components to entail a cumbersome assembling process. Meanwhile, piezoelectric filters are often required to be as thin as several millimeters to meet the trend of downsizing. Additionally, they are required to be configured in such a way that each of the piezoelectric filters can be electrically connected with relative ease to a predetermined electric path arranged on a plane that carries resonators thereon and the resonators are electrically and mechanically protected.

Still additionally, piezoelectric filters should be easy to manufacture and assemble.

SUMMARY OF THE INVENTION

In view of these circumstances, it is therefore an object of the present invention to provide a multilayer type piezoelectric filter that can solve the above identified problems.

According to the invention, there is provided a multilayer type piezoelectric filter comprising;

a plurality of resonator elements arranged to form a multilayer structure vertically extended, each being surrounded by a frame-like spacer element;

a plurality of intermediary printed circuit board elements each interposed between the adjacent resonator elements, each being provided with predetermined conducting patterns on an upper and lower surfaces thereof;

a top printed circuit board element arranged on the top of the resonator elements and provided with a predetermined conducting pattern on a lower surface thereof; and a bottom printed circuit board element arranged under the bottom of the resonator elements and provided with a plurality of connection electrodes on a lower surface and predetermined conducting paths on an upper and lower surfaces thereof;

the frame-like spacer elements, the top printed circuit board element and said bottom printed circuit board element being bonded together at the peripheral edges thereof;

each electrode of each of the resonator elements being connected by means of the conducting patterns provided on the respective printed circuit board elements to one of the connection electrodes on the bottom printed circuit board element to form a predetermined filter circuit.

In the multilayer type piezoelectric filter according to the present invention, each frame-like spacer element may be provided with conducting grooves on a front and rear edges thereof which are arranged to form conducting paths vertically extended.

Preferably, coating resists may be provided on an upper and lower surfaces of each of the intermediary printed circuit board members, a lower surface of the top printed circuit board member and an upper surface of the bottom printed circuit board member for substantially covering the conducting patterns on those printed circuit board members to electrically insulate them from each other.

With the above arrangement, the piezoelectric filter shows a simple configuration of a multilayer structure of a number of elements and hence can be down-sized particularly in terms of height. At the same time, the piezoelectric filter can be very robust and is electrically and mechanically protected because each of the resonator elements is protected by a frame-like spacer and the top and bottom printed circuit board members.

Preferably, the piezoelectric filter according to the present invention may comprise three plate-like resonator elements, of which one is either a series resonator or a parallel resonator and the other two are parallel resonators or series resonators, whichever appropriate.

Alternatively, the piezoelectric filter according to the present invention may comprise six plate-like resonator elements, three of which are arranged to form a T-type circuit of a S-P-S structure, the other three are arranged to form a π-type circuit of a P-S-P structure.

With this arrangement, a filter circuit comprising six element sheets is provided by two filters and each of the filter can be down-sized particularly in terms of height.

Preferably, the components of the piezoelectric filter may be bonded together by means of adhesive sheets held in face contact with the respective frame-like spacers. Each of the adhesive sheets may be frame-like which is substantially similar to that of the frame-like spacer elements.

Then, the piezoelectric filter can be produced simply by laying the components including the adhesive sheets one on the other to a multilayer structure and heating the components. Thus, such piezoelectric filters may be manufactured on a mass production basis in a simple fashion.

DETAILED DESCRIPTION OF THE PREFERRED EMBODIMENTS

Now, the present invention will be described in greater detail by referring to the accompanying drawings that illustrate two preferred embodiments of the present invention, a multilayer type piezoelectric filter $F_1$ and another multilayer type piezoelectric filter $F_2$.

Figure 1:
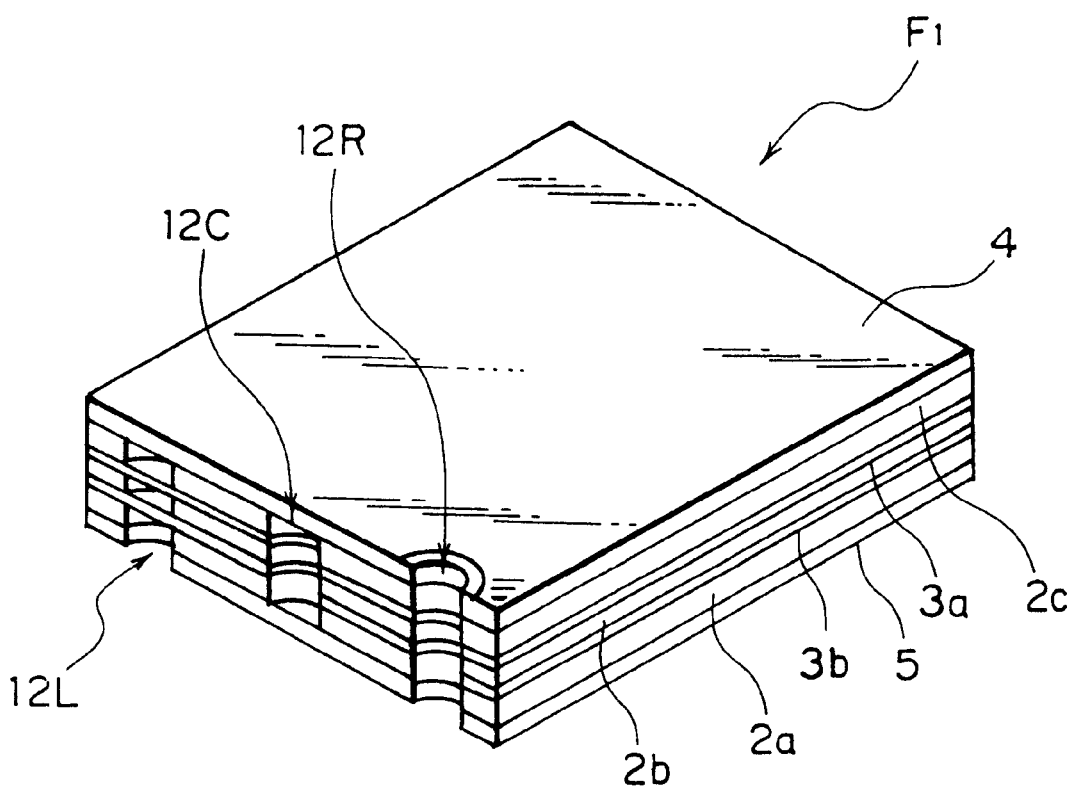
FIG. 1 is a schematic perspective view of a multilayer type piezoelectric filter according to the present invention.
Figure 2:
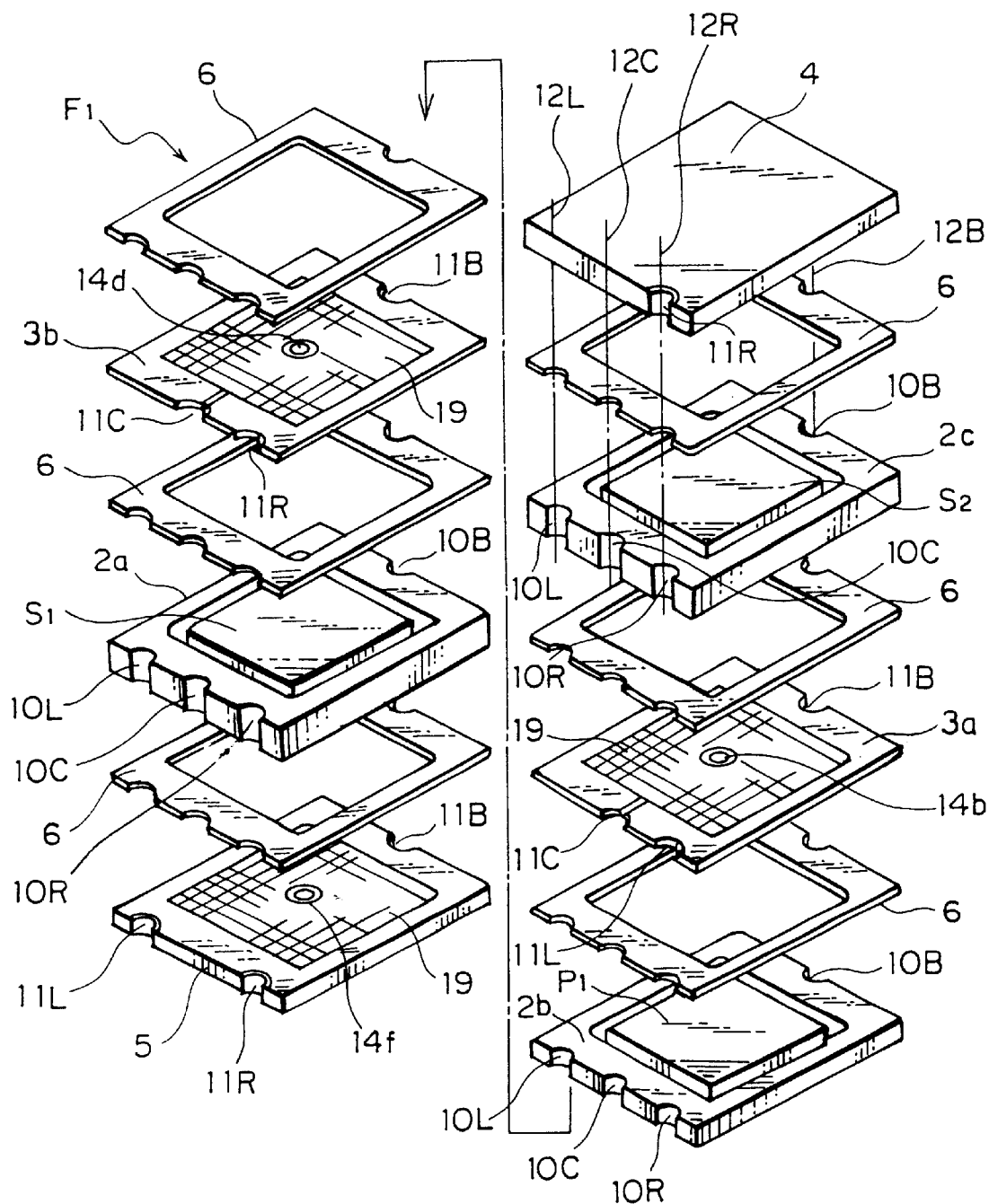
FIG. 2 is an exploded schematic perspective view of the multilayer type piezoelectric filter of FIG. 1.

FIGS. 1 and 2 schematically illustrate the multilayer type piezoelectric filter $F_1$ having a S-P-S (series-parallel-series) structure. The illustrated filter $F_1$ comprises a series resonator $S_1$, a parallel resonator $P_1$ and a series resonator $S_2$ which are surrounded by respective frame-like spacers 2a, 2b, 2c and laid one on the other with intermediary printed circuit boards 3a and 3b interposed therebetween. A top printed circuit board 4 and a bottom printed circuit board 5 are arranged respectively on the top and under the bottom of the multilayered resonators. Then, the components are bonded together by means of frame-like adhesive sheets 6 made of a thermosetting resin material and interposed therebetween.

The above arrangement will be discussed in greater detail hereinafter.

Figure 3A:
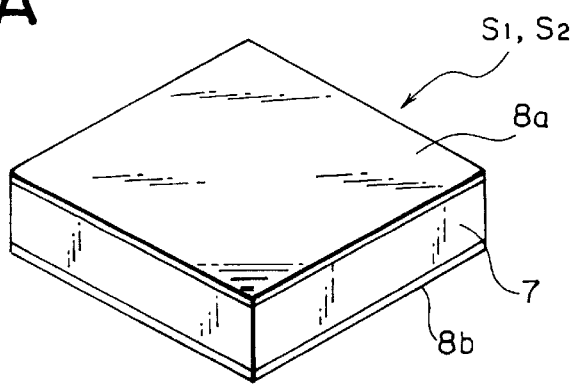
FIGS. 3A and 3B respectively show a schematic perspective view of the series resonators and a schematic perspective view of the parallel resonators of the multilayer type piezoelectric filter of FIG. 1.
Figure 3B:
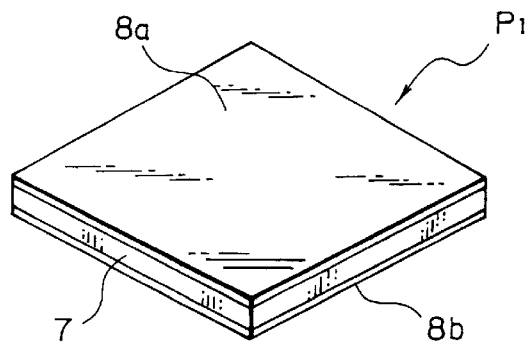

As seen from FIGS. 3A and 3B, each of the resonators $S_1$, $S_2$ and $P_1$ shows a thin rectangularly parallelepipedic profile and is typically made of lead titanate zirconate. Each of the resonators comprises a piezoelectric ceramic substrate 7 having a predetermined height. Electrodes 8a and 8b are arranged respectively on the top and under the bottom of the substrate 7. The parallel resonator $P_1$ shown in FIG. 3B has a height smaller than that of the series resonator $S_1$ or $S_2$ shown in FIG. 3A so as to have an electrostatic capacitance greater than that of each series resonator. A large capacitance ratio is obtained to increase the attenuation effect of the piezoelectric filter by reducing the thickness of the parallel resonators relative to the series resonators.

Frame-like spacers 2a, 2b, 2c respectively surrounding the resonators $S_1$, $S_2$, $P_1$ have respective heights same as those of the corresponding resonators. Thus, each of the frame-like spacers 2a, 2c surrounding the respective series resonators $S_1$, $S_2$ has a thickness larger than that of the frame-like spacer 2b surrounding the parallel resonator $P_1$. The parallel resonator $P_1$ and the corresponding spacer 2b may preferably have a thickness of 0.18 mm, while the series resonators $S_1$, $S_2$ and the corresponding spacers 2a, 2c may preferably have a thickness of 0.35 mm or 0.52 mm.

Figure 4:
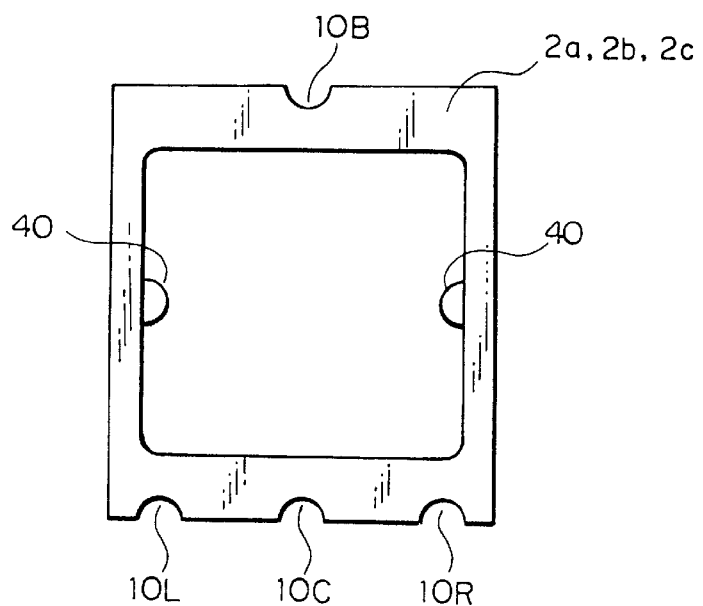
FIG. 4 is a schematic plan view of a frame-like spacer used in the multilayer type piezoelectric filter of FIG. 1.

As shown in FIG. 4, each of the frame-like spacers 2a, 2b, 2c has three arcuate conducting grooves 10L, 10C, 10R along the front edge thereof and an arcuate conducting groove 10B along the rear edge thereof.

Each of the intermediary printed circuit boards 3a, 3b is provided with two arcuate conducting grooves 11C, 11R along the front edge thereof and an arcuate conducting groove 11B along the rear edge thereof. The top printed circuit board 4 is provided with an arcuate conducting groove 11R on the rear edge thereof. The bottom printed circuit board 5 has two arcuate conducting grooves 11L, 11R formed along the front edge thereof and an arcuate conducting groove 11B formed on rear edge thereof.

The conducting grooves 10L, 10C, 10R, 10B of all the spacers are aligned with the corresponding conducting grooves 11L, 11C, 11R, 11B of the intermediary printed circuit boards 3a, 3b, the top printed circuit board 4 and the bottom printed circuit board 5 in a vertical direction of the assembly. Thus, vertical conducting paths 12L, 12C, 12R, 12B are defined by those conducting grooves.

Each of the frame-like spacers 2a, 2b, 2c may be provided with holding projections 40. The holding projections 40 are arranged at respective positions on the inner periphery thereof where they abut the corresponding nodes of contour oscillation of the corresponding resonator $S_1$, $P_1$ or $S_2$, whichever appropriate, as shown in FIG. 4 in order to allow the frame-like spacers 2a, 2b, 2c to hold the resonators $S_1$, $P_1$, $S_2$ with a predetermined gap interposed therebetween.

Now, the electric connection of the electrodes 8a, 8b on the top and the bottom of each of the resonators $S_1$, $P_1$, $S_2$ by way of the conduction paths arranged on the tops and the bottoms of the intermediary printed circuit boards 3a, 3b, the top printed circuit board 4 and the bottom printed circuit board 5 will be discussed below.

Figure 5A:
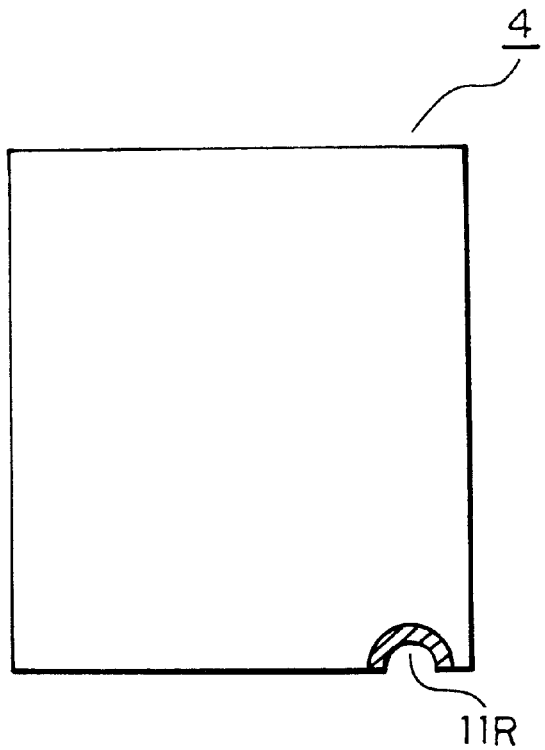
FIGS. 5A and 5B respectively show a schematic top view and a schematic bottom view of the top printed circuit board in the multilayer type piezoelectric filter of FIG. 1.
Figure 5B:
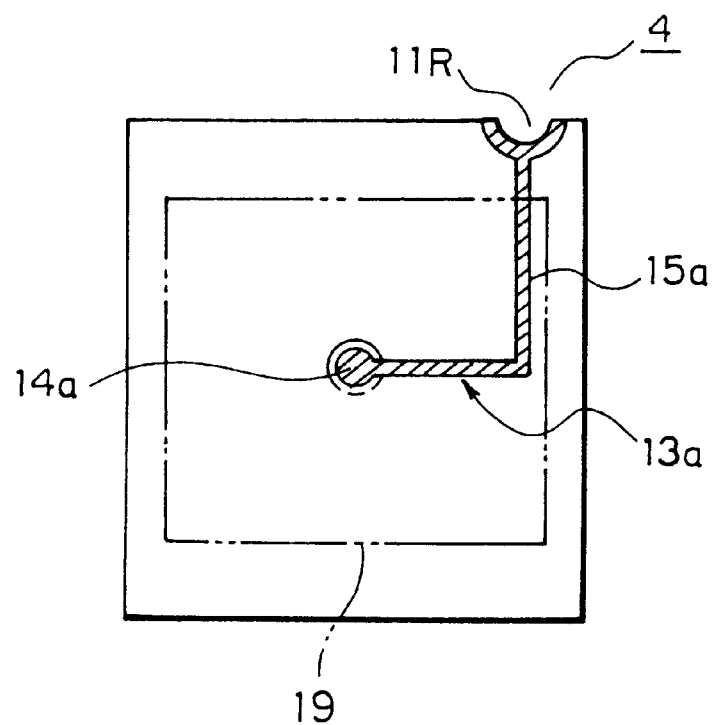

Firstly, referring to FIGS. 5A and 5B, the top printed circuit board 4 is illustrated. The top printed circuit board 4 is provided with a conduction pattern 13a on the lower surface thereof. The conduction pattern 13a includes an arcuate connection terminal 14a and a L-shaped conduction path 15a and is connected to the conducting groove 11R formed near the right end of the front edge of the top printed circuit board 4 in FIG. 5B. The connection terminal 14a is connected to the center of the upper surface electrode of the series resonator $S_2$.

Figure 6A:
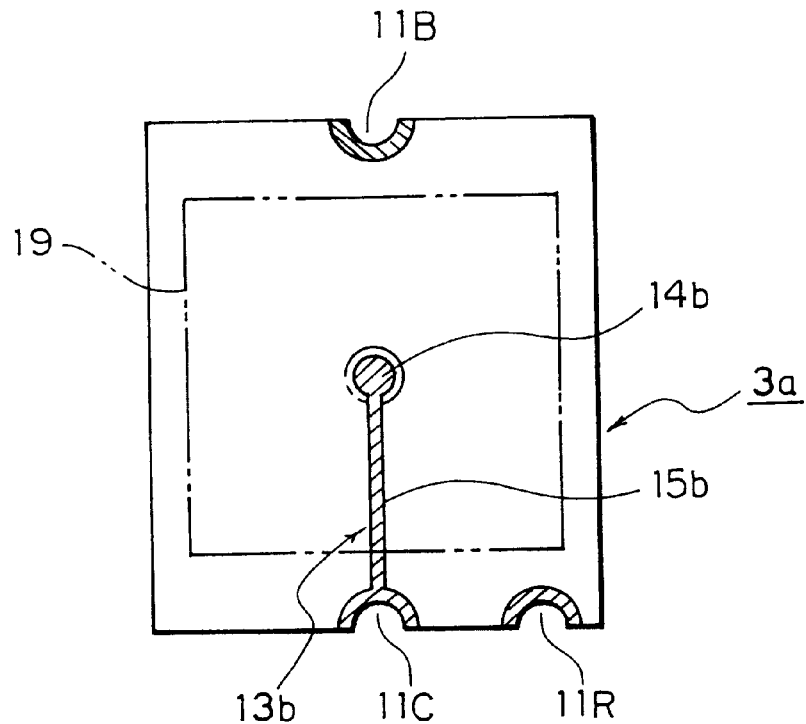
FIGS. 6A and 6B respectively show a schematic top view and a schematic bottom view of one of the intermediary printed circuit boards shown in FIG. 1.
Figure 6B:
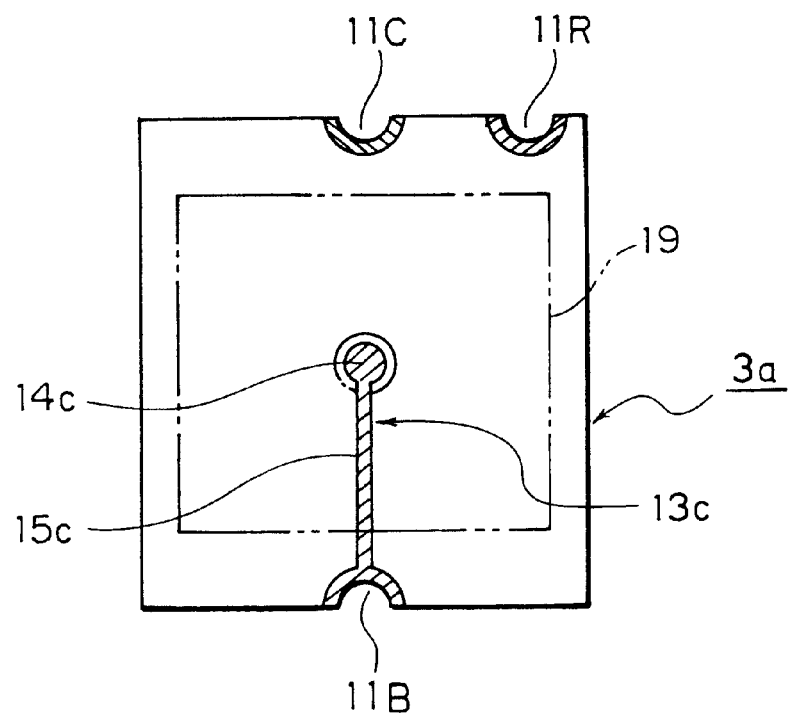

FIGS. 6A and 6B illustrate the intermediary printed circuit board 3a. As shown in FIG. 6A, the intermediary printed circuit board 3a is provided with a conduction pattern 13b on the upper surface thereof. This conduction pattern 13b includes an arcuate connection terminal 14b and a straight conduction path 15b. The straight conduction path 15b has one end connected to the connection terminal 14b and the other end connected to the conducting groove 11C formed at the center of the front edge of the intermediary printed circuit board 3a. The connection terminal 14b is connected to the center of the lower surface electrode of the series resonator $S_2$. As shown in FIG. 6B, on the lower surface of the intermediary printed circuit board 3a is provided a conduction pattern 13c which includes an arcuate connection terminal 14c and a straight conduction path 15c. One end of the straight conduction path 15c is connected to the connection terminal 14c and the other end thereof is connected to the conducting groove 11B formed at the center of the rear edge of the intermediary printed circuit board 3a. The connection terminal 14c is connected to the center of the upper surface electrode of the parallel resonator $P_1$.

Figure 7A:
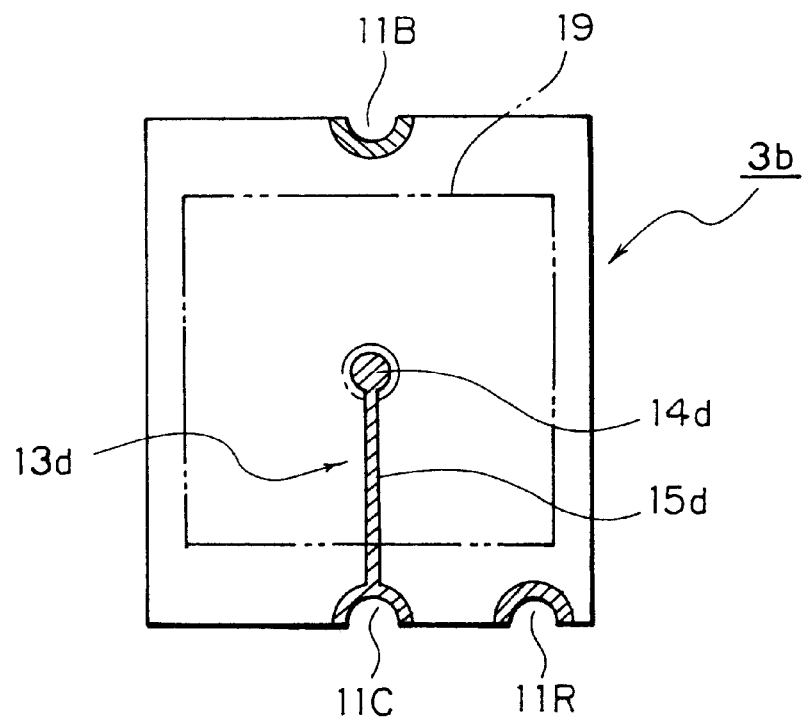
FIGS. 7A and 7B respectively show a schematic top view and a schematic bottom view of another intermediary printed circuit board shown in FIG. 1.
Figure 7B:
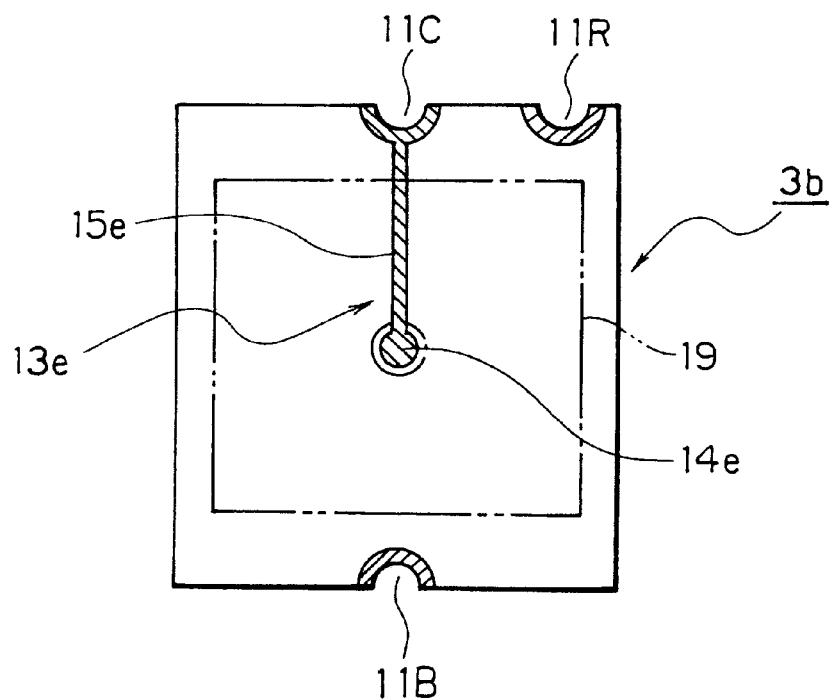

FIGS. 7A and 7B illustrate the intermediary printed circuit board 3b. As shown in FIG. 7A, on the upper surface of the intermediary printed circuit board 3b there is provided a conduction pattern 13d which comprises an arcuate connection terminal 14d and a straight conduction path 15d. One of the conduction path 15d is connected to the connection terminal 14d and the other end thereof is connected to the conducting groove 11C formed at the center of the front edge of the intermediary printed circuit board 3b. The connection terminal 14d is connected to the center of the lower surface electrode of the parallel resonator $P_1$.

As shown in FIG. 7B, on the lower surface of the intermediary printed circuit board 3b is formed a conduction pattern 13e which comprises an arcuate connection terminal 14e and a straight conduction path 15e. The conduction path 15e has one end connected to the connection terminal 14e and the other end connected to the conducting groove 11C formed at the center of the front edge of the intermediary printed circuit board 3b. The connection terminal 14e is connected to the center of the upper surface electrode of the series resonator $S_1$.

Figure 8A:
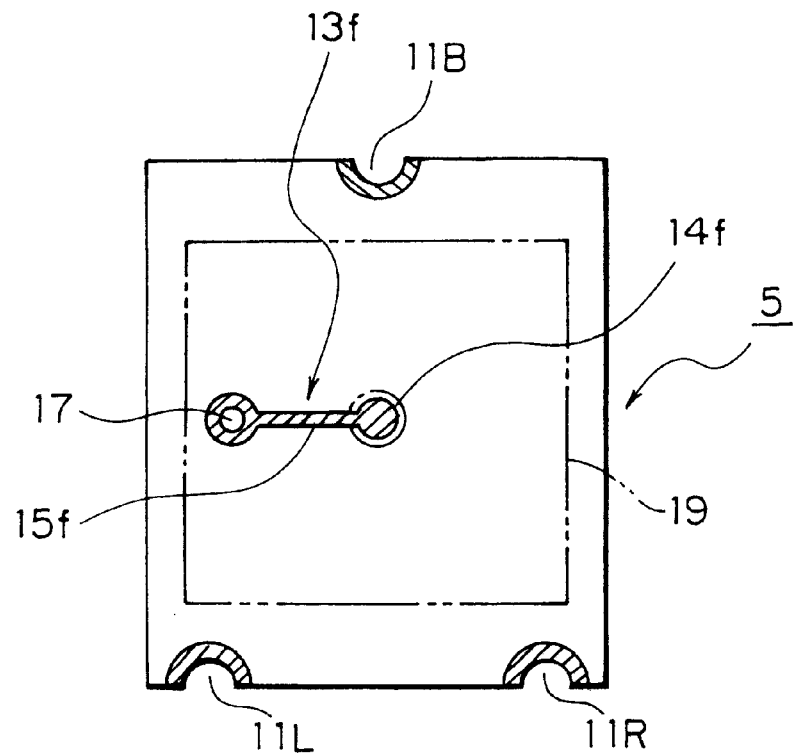
FIGS. 8A and 8B respectively show a schematic top view and a schematic bottom view of the bottom printed circuit board shown in FIG. 1.
Figure 8B:
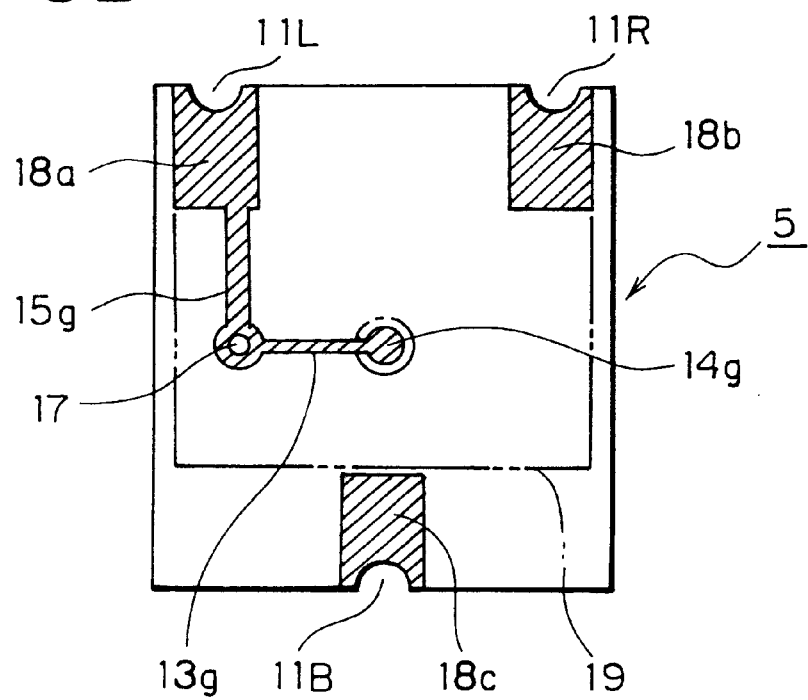

FIGS. 8A and 8B illustrate the bottom printed circuit board 5. As shown in FIG. 8A, a conduction pattern 13f is formed on the upper surface of the bottom printed circuit board 5 and includes an arcuate connection terminal 14f and a straight conduction path 15f. The straight conduction path 15f is extended laterally and has one end connected to the connection terminal 14f and the other end connected to a through hole 17 formed in the bottom printed circuit board 5 and having an inner conductor wall.

On the lower surface of the bottom printed circuit board 5, as shown in FIG. 8B, there is provided a conduction pattern 13g which comprises a connection terminal 14g and a L-shaped conduction path 15g. Further, on the lower surface of the bottom printed circuit board 5, an input electrode 18a and an output electrode 18b are formed at the respective corners of the front edge thereof and a grounding electrode 18c is formed at the center of the rear edge thereof.

The L-shaped conduction path 15g has one end connected to the connection terminal 14g, the other end connected to the input electrode 18a arranged at the upper left corner in FIG. 8B and an intermediate portion connected to the through hole 17. Therefore, the conduction pattern 13f on the upper surface of the board 5 is connected to the conduction pattern 13g formed on the lower surface of the board 5 by way of the through hole 17.

The conducting groove 11L is connected to the input electrode 18a, while the conducting groove 11R is connected to the output electrode 18b and the conducting groove 11B is connected to the grounding electrode 18c.

The upper and lower surfaces of the intermediary printed circuit boards 3a, 3b, the lower surface of the top printed circuit board 4 and the upper surface of the bottom printed circuit board 5 are coated with solder resist 19 to cover the conduction patterns 13a through 13f and electrically insulate them from each other. As the components of the piezoelectric filter are laid one on the other and heated, the adhesive sheets 6 are set to produce a multilayer type piezoelectric filter $F_1$ as integral unit in a simple and easy way.

With the above described embodiment, the frame-like spacers 2a, 2b, 2c, the intermediary printed circuit boards 3a, 3b, the top printed circuit board 4 and the bottom printed circuit board 5 are made of glass epoxy. Preferably, the intermediary printed circuit boards 3a, 3b may have a thickness of 0.1 mm whereas the top printed circuit board 4 and the bottom printed circuit board 5 may have a thickness of 0.2 mm. Then, the multilayer type piezoelectric filter $F_1$ may show a very small overall height of 1.7 mm. Otherwise, the length and the width of the piezoelectric filter $F_1$ may be 6.5 mm and 5.5 mm respectively. However, many other dimensional combinations may be feasible for the purpose of the invention.

Figure 14:
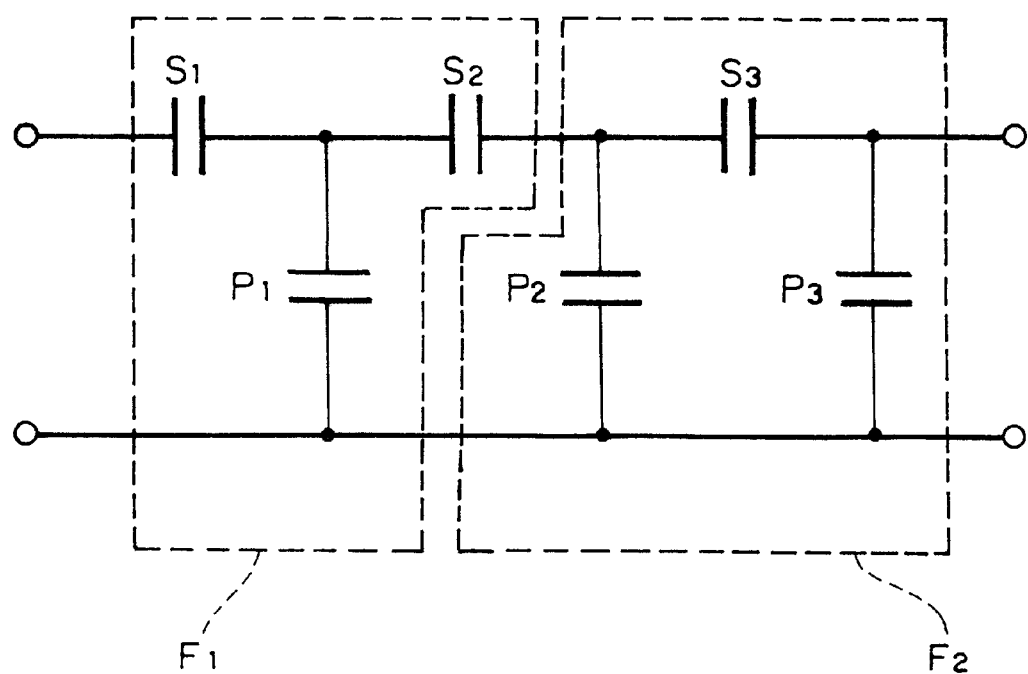
FIG. 14 is an equivalent circuit diagram of three-stage L-shaped connection arrangements comprising six element sheets.

The upper surface electrode of the series resonator $S_2$ is connected to the output connection electrode 18b on the bottom printed circuit board 5 by way of the conduction pattern 13a on the top printed circuit board 4 and the conducting path 12R. The lower surface electrode of the series resonator $S_2$, the lower surface electrode of the parallel resonator $P_1$ and the upper surface electrode of the series resonator $S_1$ are connected to each other by way of the conducting path 12C. The upper surface electrode of the parallel resonator $P_1$ is connected to the grounding connection electrode 18c on the bottom printed circuit board 5 by way of the conduction pattern 13c of the intermediary printed circuit board 3a and the conducting path 12B. The lower surface electrode of the series resonator $S_1$ is electrically connected to the input connection electrode 18a on the bottom printed circuit board 5 by way of the conduction pattern 13f of the bottom printed circuit board 5 and the conducting path 12L. In this way it is possible to assemble a multilayer type piezoelectric filter $F_1$ having an S-P-S structure. FIG. 14 shows a circuit diagram of an equivalent circuit for such a piezoelectric filter $F_1$, where a T-type circuit comprising a series resonator $S_1$, a parallel resonator $P_1$, and a series resonator $S_2$, forming a S-P-S structure, are illustrated.

Then, the components of the piezoelectric filter $F_1$ are bonded together by means of the adhesive sheets 6 arranged on and under each of the frame-like spacers 2a, 2b, 2c, and the resonators $S_1$, $P_1$, $S_2$ are sandwiched by the top printed circuit board 4 and the bottom printed circuit board 5.

Figure 9:
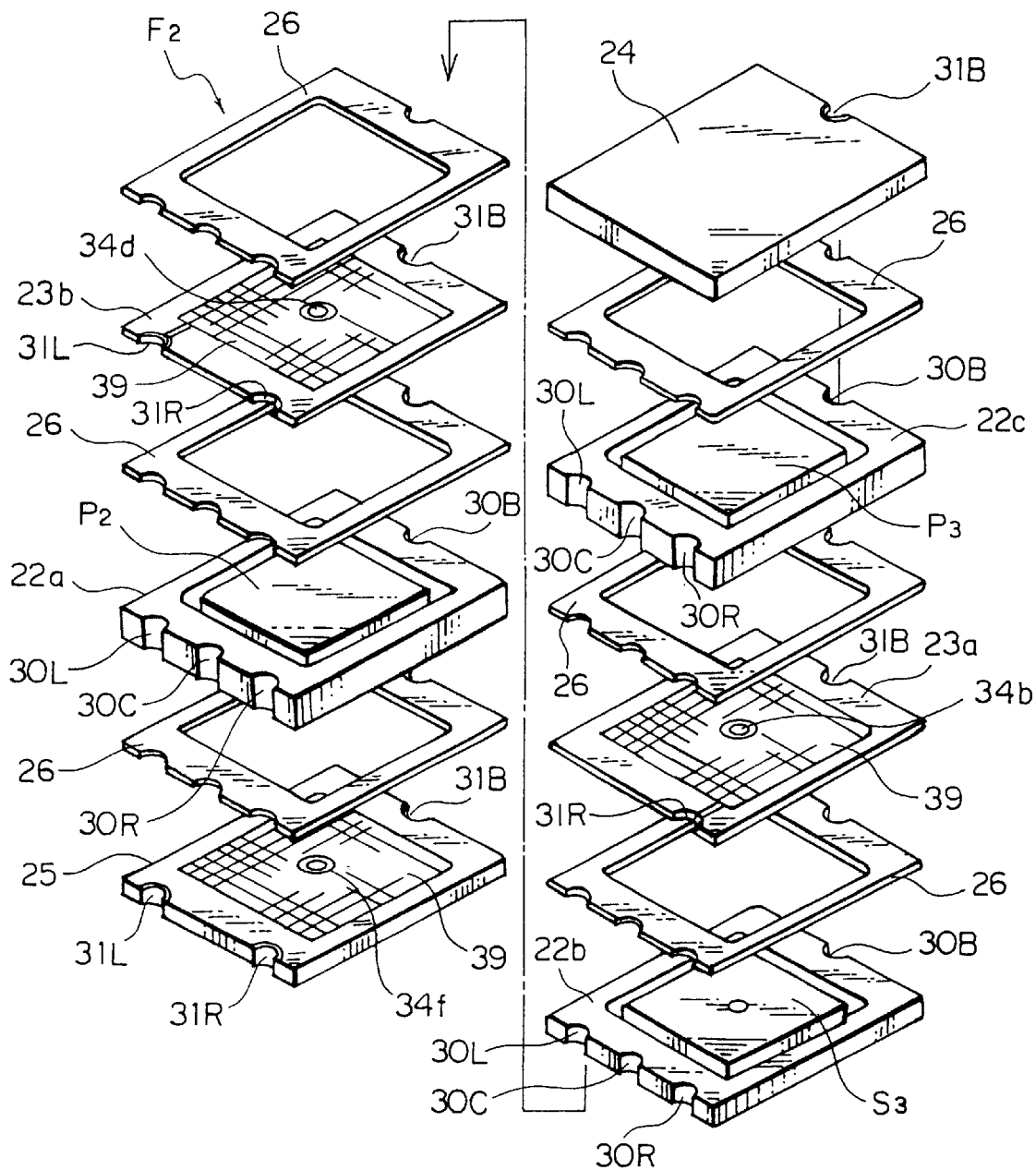
FIG. 9 is a schematic exploded perspective view of another multilayer type piezoelectric filter according to the present invention.

FIG. 9 is a schematic exploded perspective view of another embodiment of multilayer type piezoelectric filter according to the present invention, which is multilayer type piezoelectric filter $F_2$ having a P-S-P structure. The basic configuration of this embodiment is similar to that of the above described multilayer type piezoelectric filter $F_1$. It comprises a parallel resonator $P_2$, a series resonator $S_3$ and another parallel resonator $P_3$. The resonators are surround by respective frame-like spacers 22a, 22b, 22c and are arranged one on the other with intermediary printed circuit boards 23a, 23b interposed therebetween to produce a multilayer structure. The structure thus assembled is then sandwiched by a top printed circuit board 24 arranged on the top and a bottom printed circuit board 25 arranged under the bottom thereof. Then, the components are bonded together by means of frame-like adhesive sheets 26 made of a thermosetting resin material and interposed therebetween. As in the case of the first embodiment, the parallel resonators $P_2$ and $P_3$ have a height smaller than and an electrostatic capacitance greater than the series resonator $S_3$. Frame-like spacers 22a, 22b, 22c respectively surrounding the resonators $P_2$, $P_3$, $S_3$, have respective heights same as those of the corresponding resonators.

Each of the frame-like spacers 22a, 22b, 22c has three arcuate conducting grooves 30L, 30C, 30R along the front edge thereof and an arcuate conducting groove 30B along the rear edge thereof.

The intermediary printed circuit board 23a is provided with an arcuate conducting groove 31R on the front edge thereof and an arcuate conducting groove 31B on the rear edge thereof. The intermediary printed circuit board 23b is provided with two arcuate conducting grooves 31L, 31R along the front edge thereof and an arcuate conducting groove 31B on the rear edge thereof. The top printed circuit board 24 is provided with an arcuate conducting groove 31B on the rear edge thereof. The bottom printed circuit board 25 has two arcuate conducting grooves 31L, 31R formed along the front edge thereof and an arcuate conducting groove 31B formed on rear edge thereof.

The conducting grooves 30L, 30C, 30R, 30B of all the spacers are aligned with conducting grooves 31L, 31C, 31R, 31B of the intermediary printed circuit boards 23a, 23b, the top printed circuit boards 24 and the bottom printed circuit board 25 in a vertical direction of the asembly. As a result, vertical conducting paths are defined by those conducting grooves.

Now, the electric connection of the electrodes on the top and the bottom of each of the resonators $P_2$, $S_3$, $P_3$ by way of the conduction paths arranged on the tops and the bottoms of the intermediary printed circuit boards 23a, 23b, the top printed circuit board 24 and the bottom printed circuit board 25 will be described below.

Figure 10A:
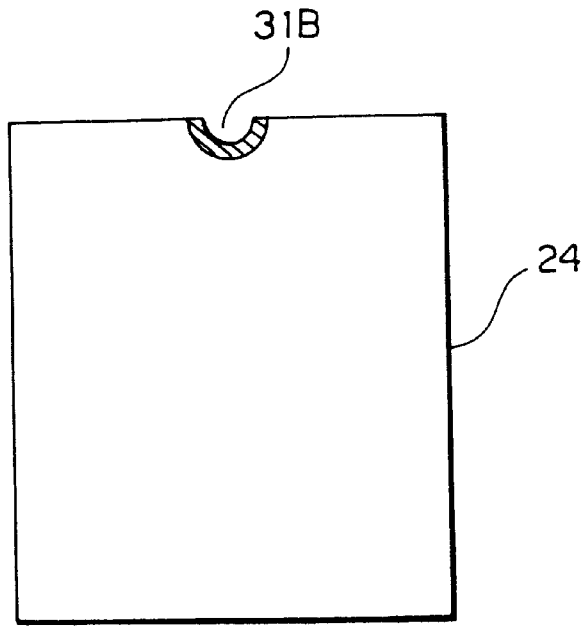
FIGS. 10A and 10B respectively show a schematic top view and a schematic bottom view of the top printed circuit board shown in FIG. 9.
Figure 10B:
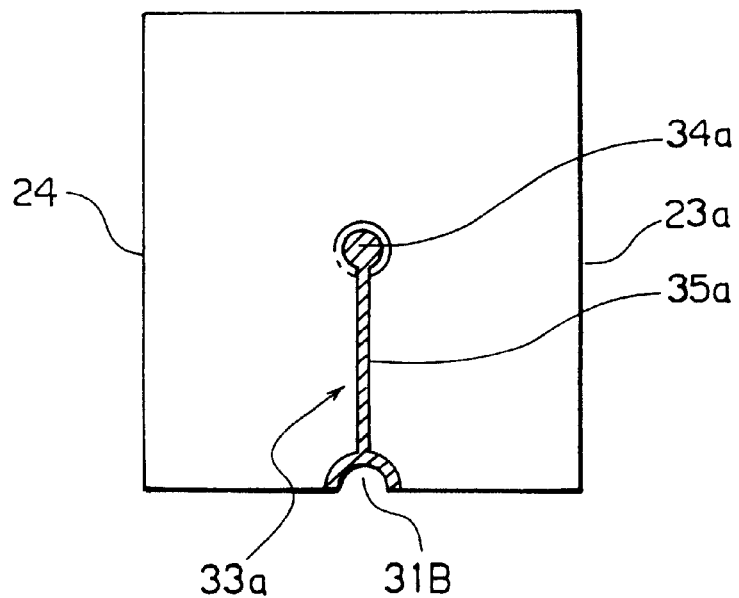

Firstly, referring to FIGS. 10A and 10B which illustrates the top printed circuit board 24, a conduction pattern 33a is provided on the lower surface of the top printed circuit board 24. The conduction pattern 33a comprises an arcuate connection terminal 34a and a straight conduction path 35a. The straight conduction path 35a has one end connected to the connection terminal 34a and the other end connected to the conducting groove 31B formed at the center of the rear edge of the top printed circuit board 24 in FIG. 10B. The connection terminal 34a is connected to the center of the upper surface electrode of the parallel resonator $P_3$.

Figure 11A:
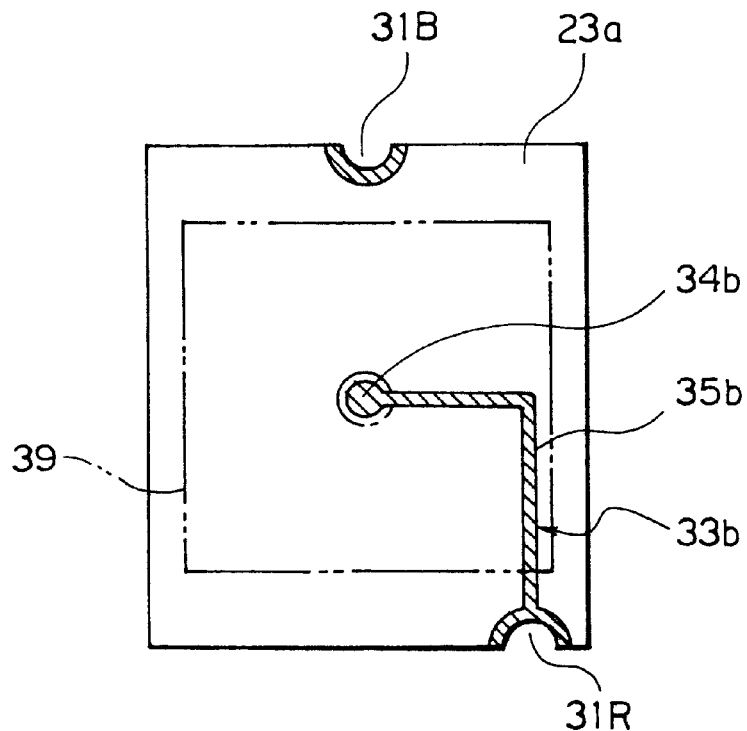
FIGS. 11A and 11B respectively show a schematic top view and a schematic bottom view of one of the intermediary printed circuit boards shown in FIG. 9.
Figure 11B:
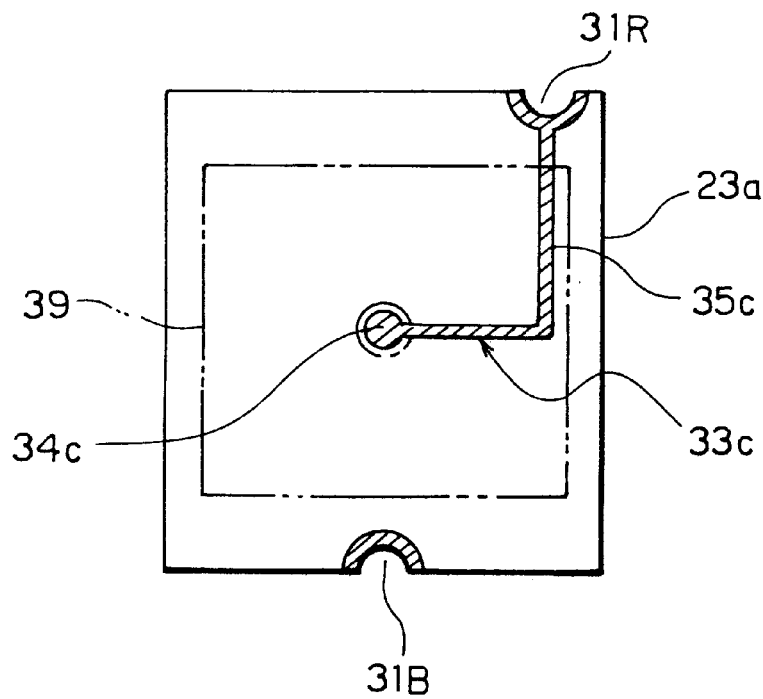

FIGS. 11A and 11B illustrate the intermediary printed circuit board 23a. As shown in FIG. 11A, on the upper surface of the intermediary printed circuit board 23a is provided a conduction pattern 33b which comprises an arcuate connection terminal 34b and a L-shaped conduction path 35b. The L-shaped conduction path 35b has one end connected to the connection terminal 34b and the other end connected to the conducting groove 31R formed at the right corner of the front edge of the intermediary printed circuit board 23a. The connection terminal 34b is connected to the center of the lower surface electrode of the parallel resonator $P_3$.

As shown in FIG. 11B, a conduction pattern 33c is formed on the lower surface of the intermediary printed circuit board 23a, and comprises an arcuate connection terminal 34c and a L-shaped conduction path 35c. This conduction path 35c is extended between the connection terminal 34c and the conducting groove 31R formed at the right corner of the front edge of the intermediary printed circuit board 23a. The connection terminal 34c is connected to the center of the upper surface electrode of the series resonator $S_3$.

Figure 12A:
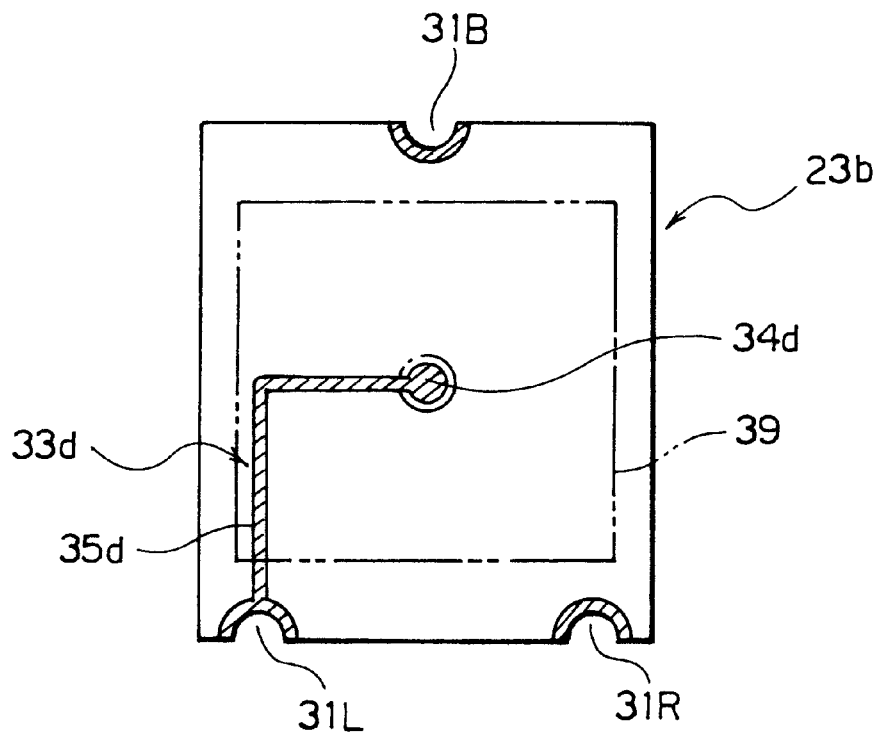
FIGS. 12A and 12B respectively show a schematic top view and a schematic bottom view of the other intermediary printed circuit board shown in FIG. 9.
Figure 12B:
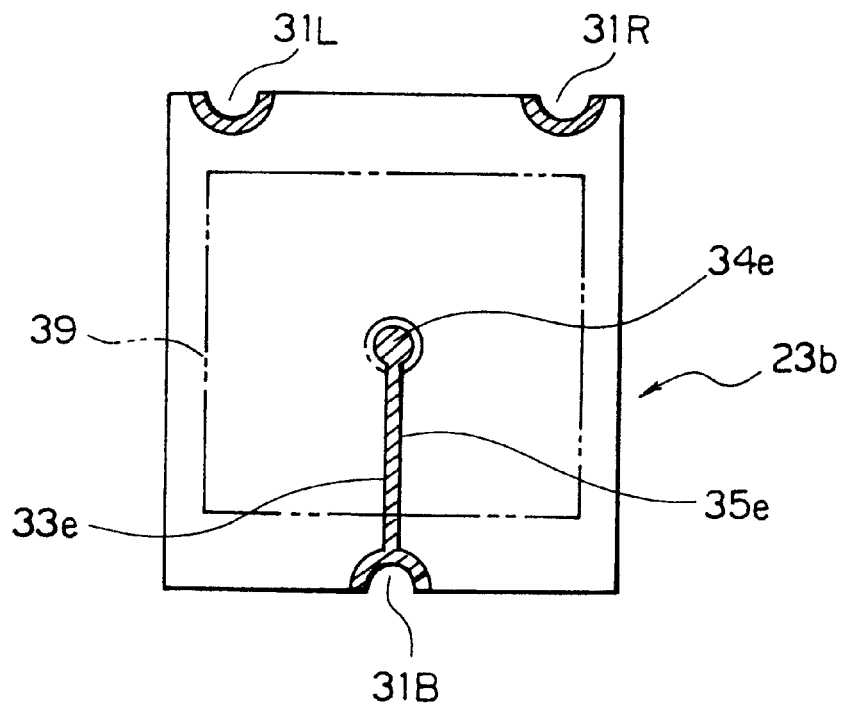

FIGS. 12A and 12B illustrate the intermediary printed circuit board 23b.

As shown in FIG. 12A, a conduction pattern 33d is formed on the upper surface of the intermediary printed circuit board 23b and comprises an arcuate connection terminal 34d and a L-shaped conduction path 35d. The conduction path 35d is extended between the connection terminal 34d and the conducting groove 31L formed at the left corner of the front edge of the intermediary printed circuit board 23b. The connection terminal 34d is connected to the center of the lower surface electrode of the series resonator $S_3$.

As shown in FIG. 12B, a conduction pattern 33e is formed on the lower surface of the intermediary printed circuit board 23b and comprises an arcuate connection terminal 34e and a straight conduction path 35e. This conduction path 35e is extended between the connection terminal 34e and the conducting groove 31B formed at the center of the rear edge of the intermediary printed circuit board 23b. The connection terminal 34e is connected to the center of the upper surface electrode of the parallel resonator $P_2$.

Figure 13A:
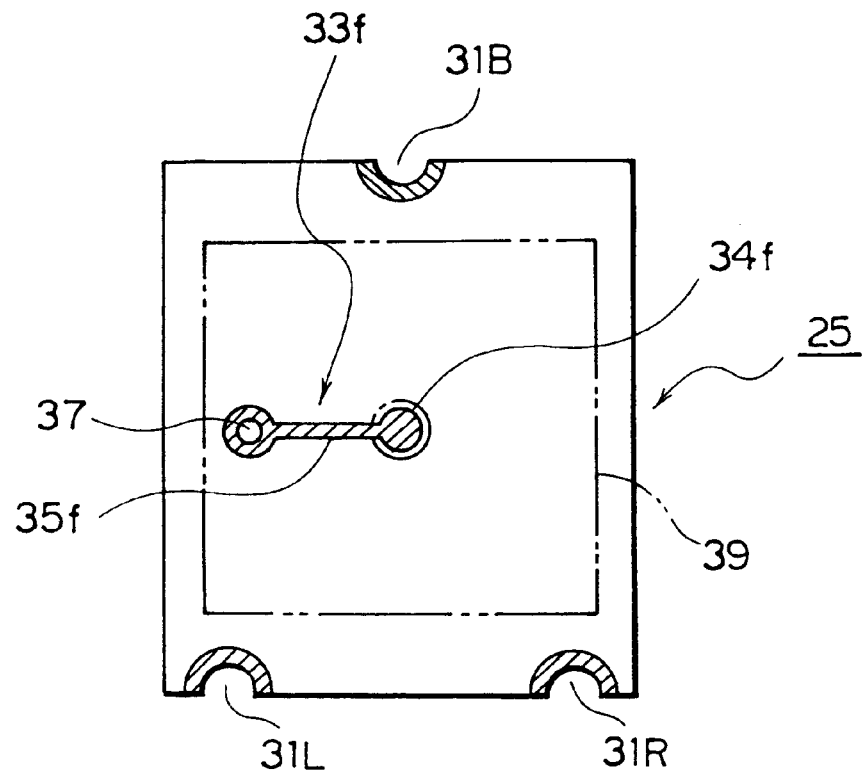
FIGS. 13A and 13B respectively show a schematic top view and a schematic bottom view of the bottom printed circuit board shown in FIG. 9.
Figure 13B:
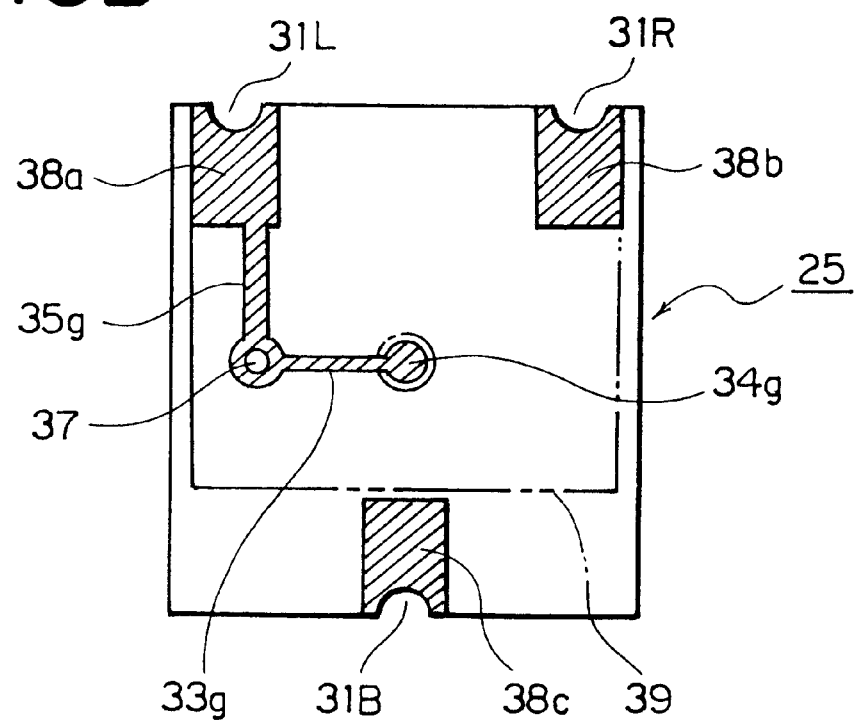

FIGS. 13A and 13B illustrate the bottom printed circuit board 25. The bottom printed circuit board 25 has a configuration similar to that of the bottom printed circuit board 5 of the first embodiment shown in FIGS. 8A and 8B. A conduction pattern 33f is formed on the upper surface of the bottom printed circuit board 25 and comprises an arcuate connection terminal 34f and a straight conduction path 35f. Also, the bottom printed circuit board 25 is provided with a through hole 37 having an inner conducting wall. The straight conduction path 35f is extended laterally and has one end connected to the connection terminal 34f and the other end connected to the through hole 37.

On the lower surface of the bottom printed circuit board 25, as shown in FIG. 13B, there is provided a conduction pattern 33g which comprises a connection terminal 34g and a L-shaped conduction path 35g. Further, on the lower surface of the bottom printed circuit board 25, an input electrode 38a and an output electrode 38b are formed at the respective corners of the front edge thereof and a grounding electrode 38c is formed at the center of the rear edge thereof.

The L-shaped conduction path 35g has one end connected to the connection terminal 34g, the other end connected to the input electrode 38a arranged at the upper left corner in FIG. 13B and an intermediate portion connected to the through hole 37. Therefore, the conduction pattern 33f on the upper surface of the board 25 is connected to the conduction pattern 33g formed on the lower surface of the board 25 by way of the through hole 37.

The respective conducting grooves 31L are connected to the input electrode 38a, the respective conducting grooves 31R are connected to the output electrode 38b and the respective conducting grooves 31B are connected to the grounding electrode 38c.

The upper and lower surfaces of the intermediary printed circuit boards 23a, 23b, the lower surface of the top printed circuit board 24 and the upper surface of the bottom printed circuit board 25 are coated with solder resist 39 to cover the conduction patterns and electrically insulate them from each other.

The upper surface electrode of the parallel resonator $P_3$ is connected to the grounding electrode 38c by way of the conducting grooves 30B, 31B. The lower surface electrode of the parallel resonator $P_3$ and the upper surface electrode of the series resonator $S_3$ are connected to the output connection electrode 38b respectively by way of the conducting grooves 30R, 31R. The lower surface electrode of the series resonator $S_3$ is connected to the input connection electrode 38a respectively by way of the conducting grooves 30L, 31L. The upper surface electrode of the parallel resonator $P_2$ is connected to the grounding connection electrode 38c respectively by way of the conducting grooves 30B, 31B. Furthermore, the lower surface electrode of the parallel resonator $P_2$ is connected to the input connection electrode 38a by way of the conducting grooves 30L, 31L. Therefore, there is provided a multilayer type piezoelectric filter $F_2$ having an P-S-P structure as shown in the right portion of an equivalent circuit of FIG. 14. In FIG. 14, where a T-type circuit comprising a series resonator $S_1$, a parallel resonator $P_1$ and a series resonator $S_2$, forming a S-P-S structure, there is formed a π-type circuit comprising a parallel resonator $P_2$, a series resonator $S_3$ and a parallel resonator $P_3$, forming a P-S-P structure. This π-type circuit is combined with the T-type circuit forming a S-P-S structure to produce a filter circuit having six element sheets realized by three-stage L-shaped connection arrangements including series resonators $S_1$ through $S_3$ and parallel resonators $P_1$ through $P_3$.

Then, the components of the piezoelectric filter are bonded together by means of the adhesive sheets 26 arranged on and under each of the frame-like spacers 22a, 22b, 22c. The resonators $P_2$, $S_3$, $P_3$ are sandwiched by the top printed circuit board 24 and the bottom printed circuit board 25. As the components of the piezoelectric filter are laid one on the other and heated, the adhesive sheets 26 are set to produce a multilayer type piezoelectric filter $F_2$ as integral unit in a simple and easy way.

The components of the above embodiment have respective thicknesses that are substantially same as those of the corresponding respective components of the multilayer piezoelectric filter $F_1$. Further, the embodiment has dimensions substantially same as those of the first embodiment in terms of the total height, the length and the width.

An equivalent circuit of a filter circuit for the multilayer type piezoelectric filter $F_2$ thus arranged is shown in FIG. 14.

As shown in FIG. 14, the multilayer piezoelectric filter $F_1$ having an above described S-P-S structure and another multilayer piezoelectric filter $F_2$ having an above described P-S-P structure are combined by connecting the electrodes 18a, 18b, 18c and 38a, 38b, 38c under the bottom of the piezoelectric filters to corresponding electric paths on the respective printed circuit boards so as to provide three-stage L-shaped connection arrangements including series resonators $S_1$ through $S_3$ and parallel resonators $P_1$ through $P_3$.

Since each of the multilayer piezoelectric filters $F_1$ and $F_2$ comprises three resonators, the obtained filter circuit shows a thickness that is remarkably reduced if compared with a circuit realized by vertically arranging six resonators.

The conduction patterns 13a through 13g and 33a through 33g of the above embodiments can be formed typically by screen printing or silver evaporation.

As described above in detail, according to the invention, there is provided a multilayer type piezoelectric filter comprising a plurality of resonators arranged to a multilayer structure, each being surrounded by a frame-like spacer, a number of intermediary printed circuit boards arranged among the resonators, a top printed circuit board arranged on the top of the resonators and a bottom printed circuit board arranged under the bottom of the resonators and provided with a plurality of connection electrodes, said frame-like spacers, said top printed circuit board and said bottom printed circuit board being bonded together at the peripheral edges thereof, each electrode of each of the resonators being connected to one of the connection electrodes to form a predetermined filter circuit. With such an arrangement, the piezoelectric filter shows a simple configuration of a multilayer structure of a number of plates and hence can be down-sized particularly in terms of height. At the same time, the piezoelectric filter can be very robust and is electrically and mechanically protected because each of the resonators is protected by a frame-like spacer and the top and bottom printed circuit boards.

Preferably, a piezoelectric filter according to the present invention comprises three plate-like resonators, of which one is either a series resonator or a parallel resonator and the other two are parallel resonators or series resonators, whichever appropriate. Then, a circuit having a S-P-S structure and a circuit having a P-S-P structure can be realized and combined together to produce a filter circuit comprising six sheet-like resonators. Such a filter circuit shows a thickness that is remarkably reduced if compared with a circuit realized by vertically arranging six resonators.

Preferably, the components of the piezoelectric filter are bonded together by means of adhesive sheets held in face contact with the respective frame-like spacers. Then, the piezoelectric filter can be produced simply by laying the components including the adhesive sheets one on the other to a multilayer structure and heating the components. Thus, such piezoelectric filters may be manufactured on a mass production basis in a simple fashion.

What we claimed is:

1. A multilayer type piezoelectric filter comprising;
    a plurality of resonator elements arranged to form a multilayer structure vertically extended, each being surrounded by a frame-like spacer element;
    a plurality of intermediary printed circuit board elements each interposed between the adjacent resonator elements, each being provided with predetermined conducting patterns on an upper and lower surfaces thereof;
    a top printed circuit board element arranged on the top of the resonator elements and provided with a predetermined conducting pattern on a lower surface thereof; and
    a bottom printed circuit board element arranged under the bottom of the resonator elements and provided with a plurality of connection electrodes on a lower surface and predetermined conducting paths on an upper and lower surfaces thereof;
    said frame-like spacer elements, said top printed circuit board element and said bottom printed circuit board element being bonded together at the peripheral edges thereof;
    each electrode of each of the resonator elements being connected by means of the conducting patterns provided on the respective printed circuit board elements to one of the connection electrodes on the bottom printed circuit board element to form a predetermined filter circuit.

2. A multilayer type piezoelectric filter according to claim 1, wherein the number of said resonator elements is three one of which is a parallel resonator and the other two are series resonators to form T-type filter circuit of a S-P-S structure.

3. A multilayer type piezoelectric filter according to claim 1, wherein the number of said resonator elements is three one of the resonator elements is a series resonator and the other two are parallel resonators to form a π-type circuit of a P-S-P structure.

4. A multilayer type piezoelectric filter according to claim 1, wherein the number of said resonator elements is six, three of which are arranged to form a T-type circuit of a S-P-S structure, the other three are arranged to form a π-type circuit of a P-S-P structure.

5. A multilayer type piezoelectric filter according to claim 1, wherein the elements of the piezoelectric filter are bonded together by means of adhesive sheet members held in face contact with the respective frame-like spacer elements.

6. A multilayer type piezoelectric filter according to claim 5, wherein each of said adhesive sheet members is frame-like which is substantially similar to that of the frame-like spacer elements.

7. A multilayer type piezoelectric filter according to claim 1, wherein each of said frame-like spacer elements is provided with conducting grooves on a front and rear edges thereof which are arranged to form vertically extended conducting paths.

8. A multilayer type piezoelectric filter according to claim 1, wherein each of said frame-like spacer elements is provided with holding projections arranged at respective positions on an inner periphery thereof where said holding projections abut corresponding nodes of contour oscillation of the associated resonator element.

9. A multilayer type piezoelectric filter according to claim 1, wherein coating means are provided on an upper and lower surfaces of each of the said intermediary printed circuit board members, a lower surface of said top printed circuit board member and an upper surface of said bottom printed circuit board member for substantially covering said conducting patterns on those printed circuit board members to electrically insulate them from each other.

\* \* \* \* \*